(12) United States Patent
Fadel et al.

(10) Patent No.: US 10,371,758 B2
(45) Date of Patent: Aug. 6, 2019

(54) TEST SYSTEM AND METHOD FOR TESTING A BATTERY PACK

(71) Applicant: LG Chem, Ltd., Seoul (KR)

(72) Inventors: Fouad Fadel, Dearborn Heights, MI (US); Dalhoon Lee, Gwacheon-si (KR)

(73) Assignee: LG Chem, Ltd. (KR)

( * ) Notice: Subject to any disclaimer, the term of this patent is extended or adjusted under 35 U.S.C. 154(b) by 161 days.

(21) Appl. No.: 14/854,538

(22) Filed: Sep. 15, 2015

(65) Prior Publication Data

US 2017/0074944 A1 Mar. 16, 2017

(51) Int. Cl.
| | | |
|---|---|---|
| *G01R 31/36* | (2019.01) | |
| *G01R 31/396* | (2019.01) | |
| *B60L 3/00* | (2019.01) | |
| *G01R 31/371* | (2019.01) | |
| *B60L 58/10* | (2019.01) | |
| *G01R 31/3835* | (2019.01) | |

(52) U.S. Cl.
CPC .......... *G01R 31/396* (2019.01); *B60L 3/0046* (2013.01); *B60L 58/10* (2019.02); *G01R 31/371* (2019.01); *G01R 31/3647* (2019.01); *G01R 31/3835* (2019.01); *Y02T 10/7005* (2013.01); *Y02T 10/705* (2013.01)

(58) Field of Classification Search
CPC ............ G01R 31/3658; G01R 31/3655; G01R 31/362; G01R 31/36
USPC ........................................................ 324/434
See application file for complete search history.

(56) References Cited

U.S. PATENT DOCUMENTS

| | | | |
|---|---|---|---|
| 6,278,596 B1 * | 8/2001 | Simpson ................... | G01R 1/36 361/101 |
| 7,058,484 B1 * | 6/2006 | Potega ...................... | G06F 1/26 320/134 |
| 9,075,098 B2 | 7/2015 | Schurman et al. | |
| 9,103,891 B2 | 8/2015 | Miyamoto | |
| 2004/0130326 A1 * | 7/2004 | Yamamoto ............ | B60L 3/0023 324/503 |
| 2007/0123304 A1 * | 5/2007 | Pattenden ................. | G06F 1/26 455/557 |
| 2007/0285057 A1 * | 12/2007 | Yano ...................... | B60L 3/0046 320/116 |
| 2008/0067960 A1 * | 3/2008 | Maeda ................... | B62D 5/046 318/400.02 |

(Continued)

*Primary Examiner* — Richard Isla
*Assistant Examiner* — Dung V Bui
(74) *Attorney, Agent, or Firm* — Lerner, David, Littenberg, Krumholz & Mentlik, LLP

(57) ABSTRACT

A test system for testing a battery pack having a high voltage terminal, a low voltage terminal, first and second battery modules, and a master microprocessor is provided. The test system includes an inverter unit and a test computer. The inverter unit iteratively grounds the high voltage terminal and the low voltage terminal. The test computer sends a first message to the master microprocessor that requests first and second voltage values of the first and second battery modules. The master microprocessor sends a second message having the first and second voltage values to the test computer which determines a first voltage deviation value. The test computer sets a test flag to a predetermined pass value if the test computer received the second message and the first voltage deviation value is less than a first threshold voltage deviation value.

9 Claims, 5 Drawing Sheets

(56) References Cited

U.S. PATENT DOCUMENTS

| | | | |
|---|---|---|---|
| 2009/0153156 A1* | 6/2009 | Ishii | G01R 27/18 324/704 |
| 2011/0218745 A1* | 9/2011 | Hasan | G01R 31/02 702/58 |
| 2012/0105001 A1* | 5/2012 | Gallegos | B60L 3/0046 320/109 |
| 2012/0249154 A1* | 10/2012 | Dao | G01R 31/025 324/509 |
| 2012/0280697 A1* | 11/2012 | Morimoto | B60L 3/0069 324/606 |
| 2014/0117996 A1* | 5/2014 | Bober | G01R 31/3631 324/426 |
| 2014/0141301 A1* | 5/2014 | Aoki | H01M 10/482 429/90 |
| 2014/0375120 A1* | 12/2014 | Bissontz | H02J 1/08 307/10.1 |
| 2015/0028808 A1* | 1/2015 | Bernardi | B60L 11/1809 320/109 |
| 2015/0130379 A1* | 5/2015 | Ando | G01R 31/025 318/400.21 |
| 2015/0168497 A1* | 6/2015 | Tabatowski-Bush | G01R 31/362 324/426 |
| 2016/0111900 A1* | 4/2016 | Beaston | H02J 7/0021 320/134 |

\* cited by examiner

TEST SYSTEM AND METHOD FOR TESTING A BATTERY PACK

BACKGROUND

The inventors herein have recognized a need for an improved test system and a method for testing a battery pack.

SUMMARY

A test system for testing a battery pack in accordance with an exemplary embodiment is provided. The battery pack has a high voltage terminal, a low voltage terminal, first and second battery modules, and a master microprocessor. The test system includes an inverter unit electrically coupled to both the high voltage terminal and the low voltage terminal. The inverter unit iteratively grounds the high voltage terminal and the low voltage terminal of the battery pack over a time interval. The test system further includes a test computer operably coupled to the master microprocessor. The test computer is programmed to send a first message to the master microprocessor during the time interval that requests first and second voltage values, indicating first and second output voltages, respectively, of the first and second battery modules, respectively. The master microprocessor is programmed to send a second message having the first and second voltage values, to the test computer, if the master microprocessor received the first message. The test computer is further programmed to determine a first voltage deviation value based on the first and second voltage values, if the test computer received the second message. The test computer is further programmed to set a test flag to a predetermined pass value indicating the battery pack is operating correctly, if the test computer received the second message and the first voltage deviation value is less than a first threshold voltage deviation value.

A method for testing a battery pack in accordance with another exemplary embodiment is provided. The battery pack has a high voltage terminal, a low voltage terminal, first and second battery modules, and a master microprocessor. The method includes providing an inverter unit electrically coupled to both the high voltage terminal and the low voltage terminal of the battery pack. The method further includes providing a test computer operably coupled to the master microprocessor. The method further includes iteratively grounding the high voltage terminal and the low voltage terminal of the battery pack over a time interval utilizing the inverter unit. The method further includes sending a first message to the master microprocessor from the test computer during the time interval that requests first and second voltage values, indicating first and second output voltages, respectively, of the first and second battery modules, respectively. The method further includes sending a second message having the first and second voltage values from the master microprocessor to the test computer, if the master microprocessor received the first message. The method further includes determining a first voltage deviation value based on the first and second voltage values utilizing the test computer, if the test computer received the second message. The method further includes setting a test flag to a predetermined pass value indicating the battery pack is operating correctly utilizing the test computer, if the test computer received the second message and the first voltage deviation value is less than a first threshold voltage deviation value.

DETAILED DESCRIPTION

Figure 1:
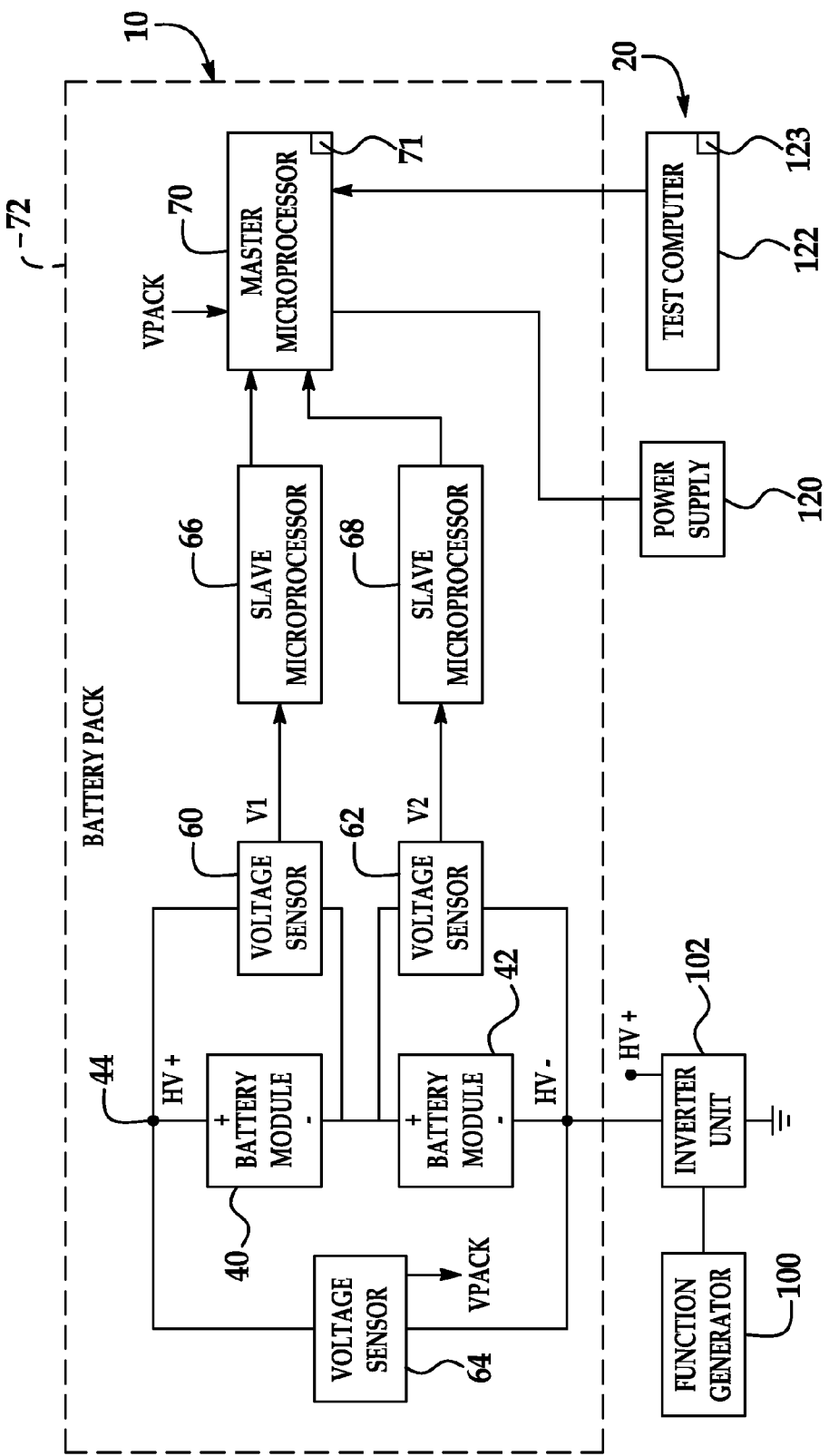
FIG. 1 is a schematic of a battery pack, and a test system for testing the battery pack in accordance with an exemplary embodiment.
Figure 2:
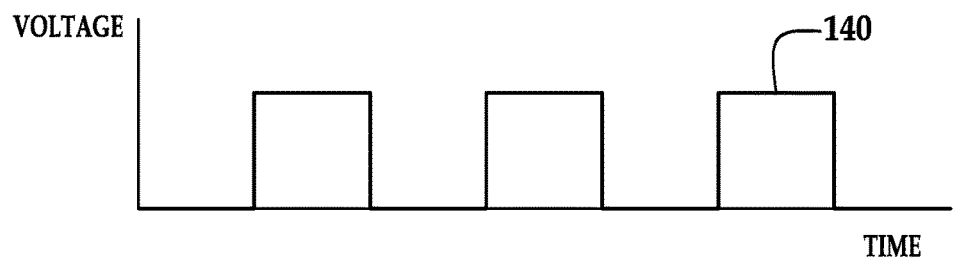
FIG. 2 is a schematic of a pulse width modulated signal generated by a function generator in the test system of FIG. 1.
Figure 3:
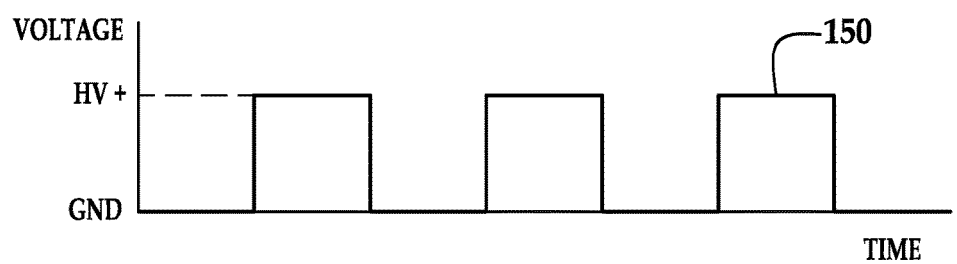
FIG. 3 is a schematic of a voltage of a high voltage terminal of the battery pack of FIG. 1 during testing of the battery pack of FIG. 1.
Figure 4:
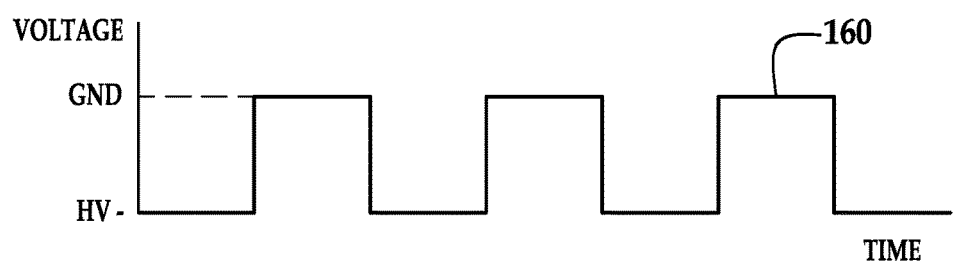
FIG. 4 is a schematic of a voltage of a low voltage terminal of the battery pack of FIG. 1 during testing of the battery pack of FIG. 1.
Figure 5:
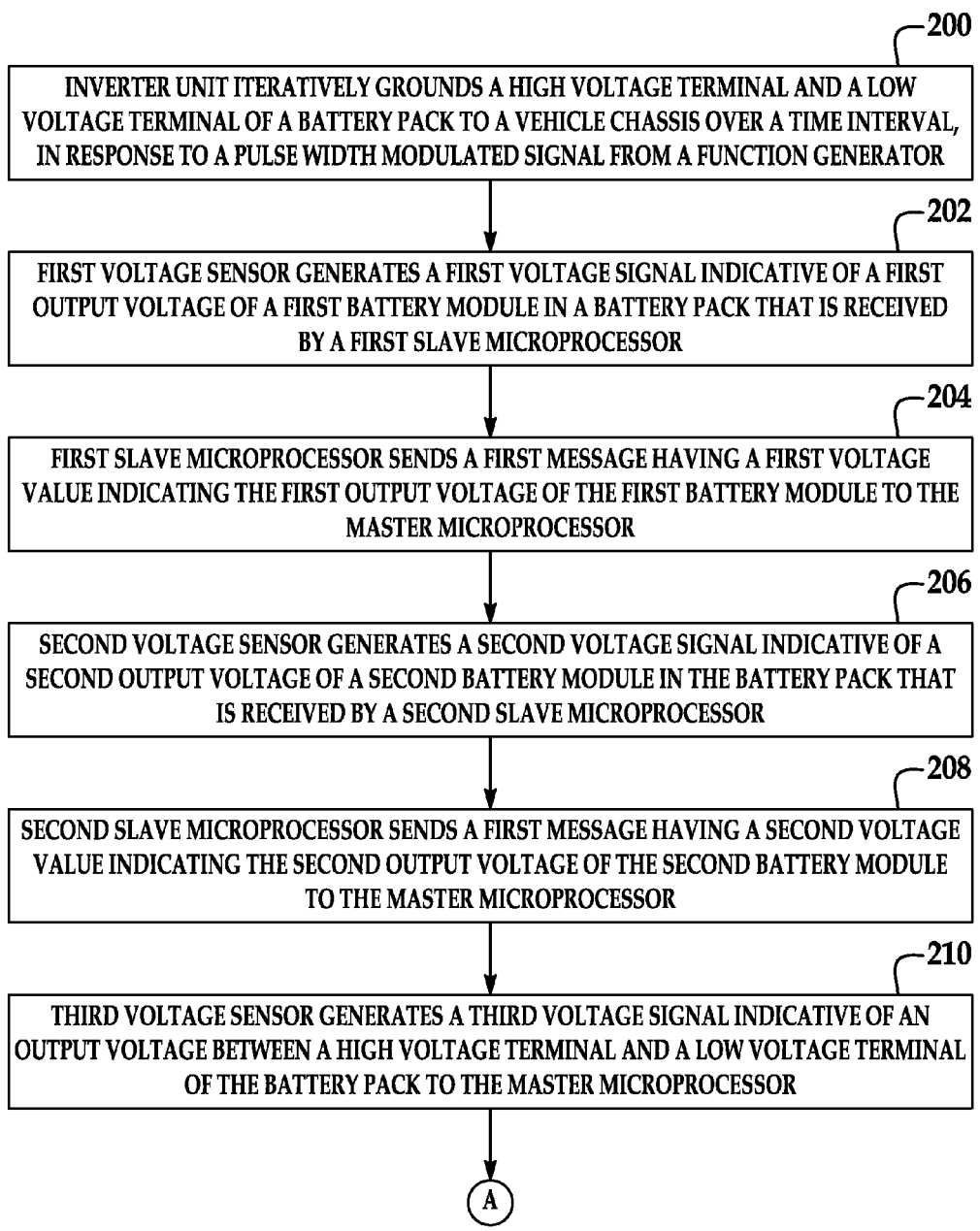
FIGS. 5-7 are flowcharts of a method for testing the battery pack of FIG. 1 in accordance with another exemplary embodiment.
Figure 6:
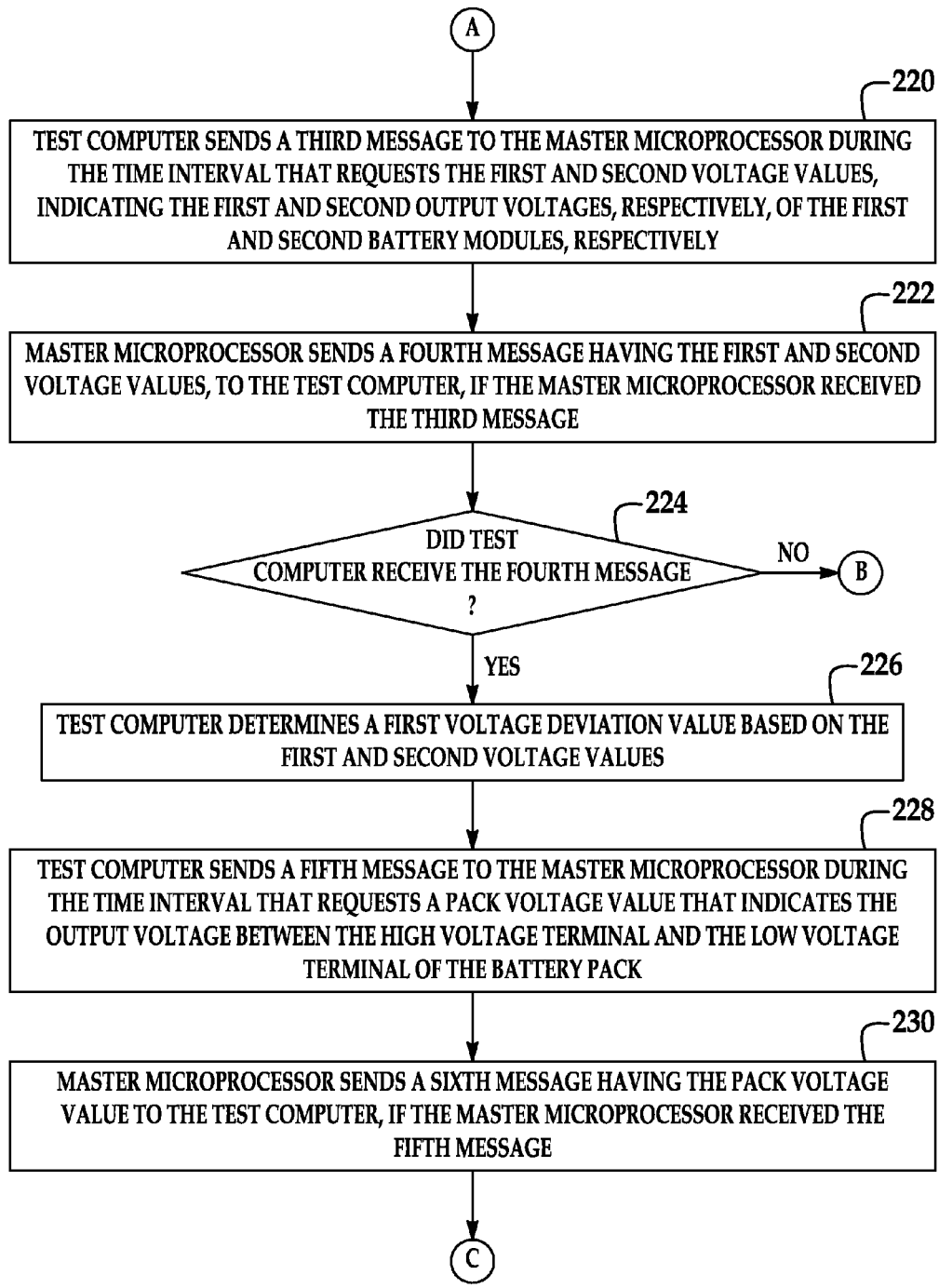
Figure 7:
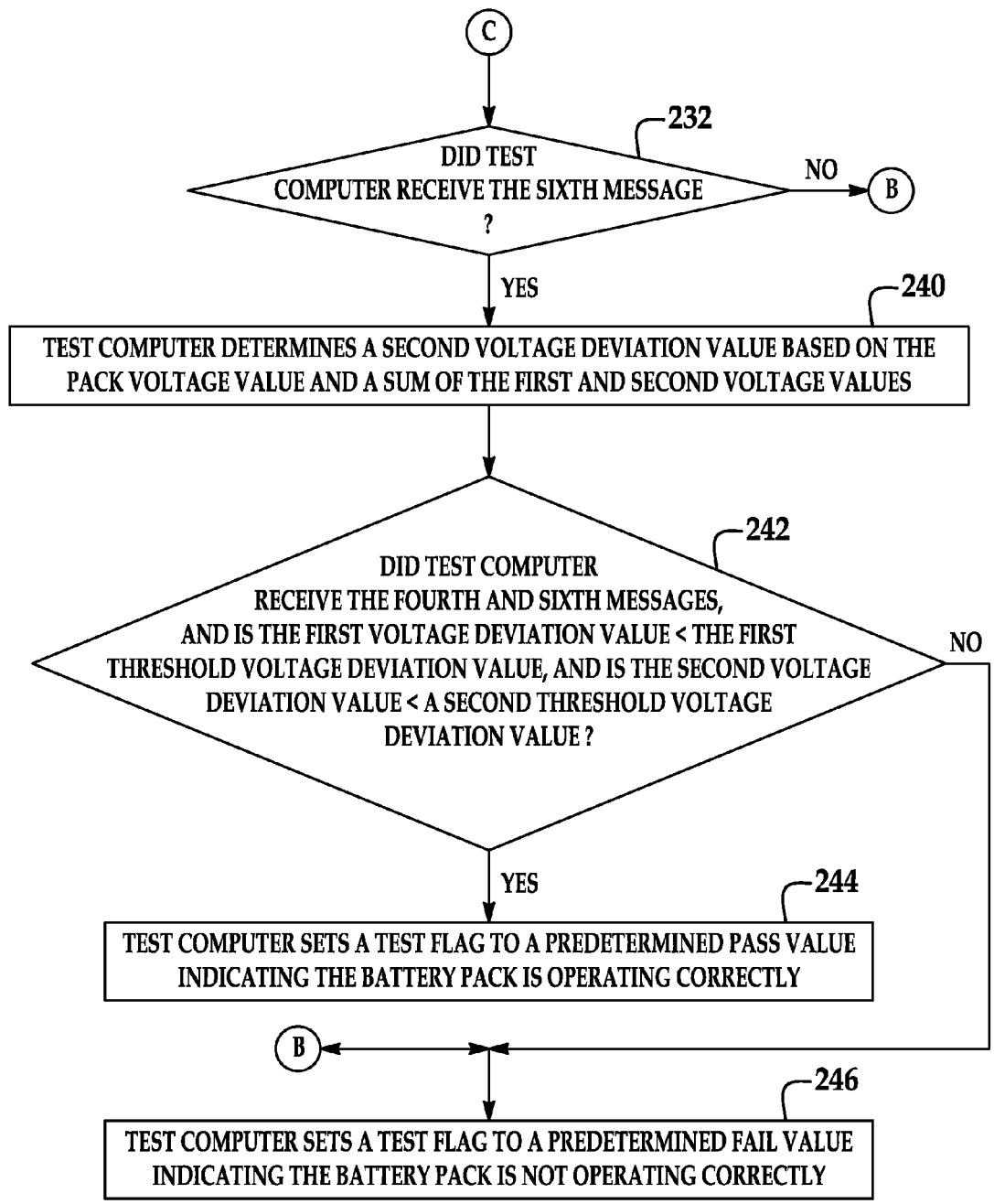

Referring to FIG. 1, a battery pack 10, and a test system 20 for testing the battery pack 10 in accordance with an exemplary embodiment is provided. An advantage of the test system 20 is that the test system 20 performs a test to simulate a ground fault error in an inverter unit 102 by electrically grounding the battery pack 10 to a vehicle chassis 103 and then determines whether communication between a master controller 70 in the battery pack 10 and a test computer 122 occurs as desired during the testing of the battery pack 10.

The battery pack 10 includes a battery module 40, a battery module 42, a high voltage terminal 44, a low voltage terminal 46, voltage sensors 60, 62, 64, slave microprocessors 66, 68, a master microprocessor 70, and a housing 72. The housing 72 holds the other components of the battery pack 10 therein.

The battery module 40 is electrically coupled in series with the battery module 42. A positive terminal of the battery module 40 is electrically coupled to the high voltage terminal 44 of the battery pack 10. A negative terminal of the battery module 40 is electrically coupled to a positive terminal of the battery module 42. A negative terminal of the battery module 42 is electrically coupled to the low voltage terminal 46 of the battery pack 10. In an alternative embodiment, a plurality of additional battery modules can be electrically coupled in series with the battery modules 40, 42.

The voltage sensor 60 is electrically coupled between the positive terminal of the battery module 40 and the negative terminal of the battery module 40. The voltage sensor 60 generates a voltage signal (V1) that is indicative of an output voltage of the battery module 40 that is received by the slave microprocessor 66.

The voltage sensor 62 is electrically coupled between the positive terminal of the battery module 42 and the negative terminal of the battery module 42. The voltage sensor 62 generates a voltage signal (V2) that is indicative of an output voltage of the battery module 42 that is received by the slave microprocessor 68.

The voltage sensor 64 is electrically coupled between the high voltage terminal 44 and the low voltage terminal 46 of the battery pack 10. The voltage sensor 64 generates a voltage signal (VPAC) that is indicative of an output voltage between the high voltage terminal 44 and the low voltage terminal 46 that is received by the master microprocessor 70.

The slave microprocessor 66 is electrically coupled to both the voltage sensor 60 and the master microprocessor 70. The slave microprocessor 66 receives the voltage signal (V1) that is indicative of an output voltage of the battery module 40 from the voltage sensor 60. Further, the slave microprocessor 66 sends a message having a first voltage value indicating the output voltage of the battery module 40 to the master microprocessor 70.

The slave microprocessor 68 is electrically coupled to both the voltage sensor 62 and the master microprocessor 70. The slave microprocessor 68 receives the voltage signal (V2) that is indicative of an output voltage of the battery module 42 from the voltage sensor 62. Further, the slave microprocessor 68 sends a message having a second voltage value indicating the output voltage of the battery module 42 to the master microprocessor 70.

The master microprocessor 70 is programmed to communicate with the test computer 122 to jointly perform a simulated ground fault test on the battery pack 10 as will be explained in greater detail below. The master microprocessor 70 is electrically coupled to the slave microprocessors 66, 68, the voltage sensor 64, the power supply 120, and the test computer 122. The power supply 120 supplies an operational voltage to the master microprocessor 70. The master microprocessor 70 includes an internal memory 71 that stores executable software and data values associated with the simulated ground fault test of the battery pack 10.

The test system 20 is provided to perform a simulated ground fault test on the battery pack 10. The test system 20 includes a function generator 100, the inverter unit 102, the power supply 120, and the test computer 122.

Referring to FIGS. 1-4, the function generator 100 is electrically coupled to the inverter unit 102. The function generator 100 generates a pulse width modulated signal 140 that is received by the inverter unit 102. In response to the pulse width modulated signal 140, the inverter unit 102 iteratively grounds the high voltage terminal 44 of the battery pack 10 over a time interval as shown in the voltage signal 150 over the time interval. Further, in response to the pulse width modulated signal 140, the inverter unit 102 iteratively grounds the low voltage terminal 46 of the battery pack 10 over a time interval as shown in the voltage signal 160 over the time interval.

The test computer 122 includes an internal memory 123 that stores executable software and data values associated with the simulated ground fault test of the battery pack 10. The functionality of the test computer 122 for performing the simulated ground fault test of the battery pack 10 will be explained in greater detail below.

Referring to FIGS. 1-5, a flowchart of a method for testing the battery pack 10 in accordance with another exemplary embodiment will now be described. In particular, the method is directed to a ground fault test of the battery pack 10.

At step 200, the inverter unit 102 iteratively grounds the high voltage terminal 44 and the low voltage terminal 46 of the battery pack 10 to a vehicle chassis 103 over a time interval, in response to a pulse width modulated signal 140 from the function generator 100. After step 200, the method advances to step 202.

At step 202, the voltage sensor 60 generates a first voltage signal indicative of a first output voltage of the battery module 40 in the battery pack 10 that is received by the slave microprocessor 66. After step 202, the method advances to step 204.

At step 204, the slave microprocessor 66 sends a first message having a first voltage value indicating the first output voltage of the battery module 40 to the master microprocessor 70. After step 204, the method advances to step 206.

At step 206, the voltage sensor 62 generates a second voltage signal indicative of a second output voltage of the battery module 42 in the battery pack 10 that is received by the slave microprocessor 68. After step 206, the method advances to step 208.

At step 208, the slave microprocessor 68 sends a second message having a second voltage value indicating the second output voltage of the battery module 42 to the master microprocessor 70. After step 208, the method advances to step 210.

At step 210, the voltage sensor 64 generates a third voltage signal indicative of an output voltage between the high voltage terminal 44 and the low voltage terminal 46 of the battery pack 10 to the master microprocessor 70. After step 210, the method advances to step 220.

At step 220, the test computer 122 sends a third message to the master microprocessor 70 during the time interval that requests the first and second voltage values, indicating the first and second output voltages, respectively, of the battery modules 40, 42, respectively. After step 220, the method advances to step 222.

At step 222, the master microprocessor 70 sends a fourth message having the first and second voltage values, to the test computer 122, if the master microprocessor 70 received the third message. After step 222, the method advances to step 224.

At step 224, the test computer 122 makes a determination as to whether the test computer 122 received the fourth message from the master microprocessor 70. If the value of step 224 equals "yes", the method advances to step 226. Otherwise, the method advances to step 246.

At step 226, the test computer 122 determines a first voltage deviation value based on the first and second voltage values. In particular, the test computer 122 determines the first voltage deviation value utilizing the following equation: first voltage deviation value=absolute value of (first voltage value−second voltage value). After step 226, the method advances to step 228.

At step 228, the test computer 122 sends a fifth message to the master microprocessor 70 during the time interval that requests a pack voltage value that indicates the output voltage between the high voltage terminal 44 and the low voltage terminal 46 of the battery pack 10. After step 228, the method advances step 230.

At step 230, the master microprocessor 70 sends a sixth message having the pack voltage value to the test computer 122, if the master microprocessor 70 received the fifth message. After step 230, the method advances to step 232.

At step 232, the test computer 122 makes a determination as to whether the test computer 122 received the sixth message from the master microprocessor 70. If the value of step 232 equals "yes", the method advances to step 240. Otherwise, the method advances to step 246.

At step 240, the test computer 122 determines a second voltage deviation value based on the pack voltage value and a sum of the first and second voltage values. In particular, the test computer 120 determines the second voltage deviation value utilizing the following equation: second voltage deviation value=absolute value of [pack voltage value−(first voltage value+second voltage value)]. After step 240, the method advances to step 242.

At step 242, the test computer 122 makes a determination as to whether the test computer 122 received the fourth and sixth messages from the master microprocessor 70, and whether the first voltage deviation value is less than the first threshold voltage deviation value, and whether the second voltage deviation value is less than a second threshold voltage deviation value. If the value of step 242 equals "yes", the method advances to step 244. Otherwise, the method advances to step 246.

At step 244, the test computer 122 sets a test flag to a predetermined pass value indicating the battery pack 10 is operating correctly. After step 244, the method is exited.

Referring again to step 242, if the value step 242 equals "no", the method advances to step 246. At step 246, the test computer 122 sets the test flag to a predetermined fail value indicating the battery pack 10 is not operating correctly. After step 246, the method is exited.

The above-described method can be at least partially embodied in the form of one or more memory devices or computer readable media having computer-executable instructions for practicing the methods. The memory devices can comprise one or more of the following: hard drives, RAM memory, flash memory, and other computer-readable media known to those skilled in the art; wherein, when the computer-executable instructions are loaded into and executed by one or more computers or microprocessors, the one or more computers or microprocessors become an apparatus programmed to practice the associated steps of the method.

The test system and the method for testing a battery pack provide a substantial advantage over other test systems and methods. In particular the test system and the method utilize an inverter unit to iteratively ground a high voltage terminal and a low voltage terminal of the battery pack over time, and then sends messages between a test computer and a master microprocessor in the battery pack to confirm that the master microprocessor is operating correctly.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A test system for determining whether a battery pack operates correctly even if the battery pack is grounded to a vehicle chassis, the battery pack having a housing, a master microprocessor, a high voltage terminal, a low voltage terminal, and first and second battery modules coupled in series to one another between the high voltage terminal and the low voltage terminal, each battery module having a positive terminal and a negative terminal, the test system comprising:

a function generator operably coupled to an inverter unit, the function generator generating a pulse width modulated signal that is received by the inverter unit;

the inverter unit being electrically coupled to both the high voltage terminal and the low voltage terminal of the battery pack, the inverter unit directly grounding the high voltage terminal of the battery pack such that the high voltage terminal has a ground voltage level during a first time interval while the low voltage terminal has a negative voltage level, in response to the pulse width modulated signal;

the inverter unit directly grounding the low voltage terminal such that the low voltage terminal has the ground voltage level during a second time interval while the high voltage terminal has a positive voltage level, in response to the pulse width modulated signal; the second time interval being after the first time interval;

the inverter unit directly grounding the high voltage terminal such that the high voltage terminal has the ground voltage level during a third time interval while the low voltage terminal has the negative voltage level, in response to the pulse width modulated signal; the third time interval being after the second time interval;

a test computer being operably coupled to the master microprocessor within the housing of the battery pack, the test computer programmed to send a first message to the master microprocessor during at least one of the first, second, and third time intervals that requests first and second voltage values, indicating a first output voltage of the first battery module and a second output voltage of the second battery module, wherein the first output voltage is indicative of a voltage difference between the positive and negative terminals of the first battery module, and wherein the second output voltage is indicative of a voltage difference between the positive and negative terminals of the second battery module;

the master microprocessor programmed to send a second message having the first and second voltage values, to the test computer, if the master microprocessor received the first message;

the test computer further programmed to determine a first voltage deviation value based on the first and second voltage values, if the test computer received the second message, the first voltage deviation value being an absolute value of a difference between the first and second voltage values; and the test computer further programmed to set a test flag to a predetermined pass value indicating the battery pack is operating correctly even if the battery pack is grounded to the vehicle chassis, if the test computer received the second message and the first voltage deviation value is less than a first threshold voltage deviation value.

2. The test system of claim 1, wherein:

the test computer further programmed to send a third message to the master microprocessor during at least one of the first, second, and third time intervals that requests a pack voltage value that indicates a third output voltage between the high voltage terminal and the low voltage terminal;

the master microprocessor further programmed to send a fourth message having the pack voltage value to the test computer, if the master microprocessor received the third message;

the test computer further programmed to determine a second voltage deviation value based on the pack voltage value and a sum of the first and second voltage values, if the test computer received the fourth message; and the test computer further programmed to set the test flag to the predetermined pass value indicating the battery pack is operating correctly even if the battery pack is grounded to the vehicle chassis, if the test computer received the second and fourth messages, and the first voltage deviation value is less than the first threshold voltage deviation value, and the second voltage deviation value is less than a second threshold voltage deviation value.

3. The test system of claim 2, wherein the test computer determines the second voltage deviation value by determining an absolute value of a difference between the pack voltage value and the sum of the first and second voltage values.

4. The test system of claim 1, further comprising a power supply operably coupled to the master microprocessor, the power supply supplying an operational voltage to the master microprocessor.

5. The test system of claim 1, wherein the test computer is disposed external of a housing of the battery pack.

6. The test system of claim 1, wherein the inverter unit grounds the high voltage terminal of the battery pack to a vehicle chassis over the first time interval, and grounds the low voltage terminal of the battery pack to the vehicle chassis over the second time interval.

7. A method for determining whether a battery pack operates correctly even if the battery pack is grounded to a vehicle chassis, the battery pack having a master microprocessor, a high voltage terminal, a low voltage terminal, first and second battery modules coupled in series to one another between the high voltage terminal and the low voltage terminal, each battery module having a positive terminal and a negative terminal, the method comprising:
   providing an inverter unit electrically coupled to both the high voltage terminal and the low voltage terminal of the battery pack;
   providing a test computer operably coupled to the master microprocessor;
   directly grounding the high voltage terminal of the battery pack such that the high voltage terminal has a ground voltage level during a first time interval utilizing the inverter unit while the low voltage terminal has a negative voltage level, in response to a pulse width modulated signal;
   directly grounding the low voltage terminal such that the low voltage terminal is transitioned from the negative voltage level to the ground voltage level during a second time interval utilizing the inverter unit while the high voltage terminal is transitioned from the ground voltage level to a positive voltage level, in response to the pulse width modulated signal, the second time interval being after the first time interval;
   directly grounding the high voltage terminal such that the high voltage terminal is transitioned from the positive voltage level to the ground voltage level during a third time interval utilizing the inverter unit while the low voltage terminal is transitioned from the ground voltage level to the negative voltage level, in response to the pulse width modulated signal, the third time interval being after the second time interval;
   sending a first message to the master microprocessor from the test computer during at least one of the first, second, and third time intervals that requests first and second voltage values, indicating a first output voltage of the first battery module and a second output voltage of the second battery module, wherein the first output voltage is indicative of a voltage difference between the positive and negative terminals of the first battery module and the second output voltage is indicative of a voltage difference between the positive and negative terminals of the second battery module;
   sending a second message having the first and second voltage values from the master microprocessor to the test computer, if the master microprocessor received the first message;
   determining a first voltage deviation value based on the first and second voltage values utilizing the test computer, if the test computer received the second message, the first voltage deviation value being an absolute value of a difference between the first and second voltage values; and
   setting a test flag to a predetermined pass value indicating the battery pack is operating correctly, even if the battery pack is grounded to the vehicle chassis, utilizing the test computer, if the test computer received the second message and the first voltage deviation value is less than a first threshold voltage deviation value.

8. The method of claim 7, further comprising:
   sending a third message to the master microprocessor from the test computer during the time interval that requests a pack voltage value that indicates a third output voltage between the high voltage terminal and the low voltage terminal;
   sending a fourth message having the pack voltage value to the test computer from the master microprocessor, if the master microprocessor received the third message;
   determining a second voltage deviation value based on the pack voltage value and a sum of the first and second voltage values utilizing the test computer, if the test computer received the fourth message; and
   setting the test flag to the predetermined pass value indicating the battery pack is operating correctly utilizing the test computer, if the test computer received the second and fourth messages, and the first voltage deviation value is less than the first threshold voltage deviation value, and the second voltage deviation value is less than a second threshold voltage deviation value.

9. A test system for determining whether a battery pack operates correctly even if the battery pack is grounded to a vehicle chassis, the battery pack having a master microprocessor, a high voltage terminal, a low voltage terminal, and first and second battery modules coupled in series to one another between the high voltage terminal and the low voltage terminal, each battery module having a positive terminal and a negative terminal, the test system comprising:
   an inverter unit adapted to be electrically coupled to both the high voltage terminal and the low voltage terminal, the inverter unit configured to alternate between directly grounding the high voltage terminal of the battery pack and directly grounding the low voltage terminal of the battery pack at respective times within a time interval; and
   a test computer adapted to be operably coupled to the master microprocessor, the test computer programmed to:
      send a first message to the master microprocessor during the time interval, the first message requesting each of (i) a first voltage value during the time interval, the first voltage value indicating a first output voltage of the first battery module during the time interval based on a voltage difference between the positive and negative terminals of the first battery module, and (ii) a second voltage value during the time interval, the second voltage value indicating a second output voltage of the second battery module based on a voltage difference between the positive and negative terminals of the second battery module;
      in response to receiving a second message from the master microprocessor indicating the requested first voltage value and the second voltage value, determine a first voltage deviation value based on a difference between the first voltage value and the second voltage value, wherein the first voltage deviation value is a magnitude of the difference between the first voltage value and the second voltage value; and if the first voltage deviation value is less than a first threshold voltage deviation value, set a test flag to a predetermined pass value indicating the battery pack is operating correctly even if the battery pack is grounded to the vehicle chassis.

* * * * *